(12) United States Patent
Urano et al.

(10) Patent No.: US 8,198,104 B2
(45) Date of Patent: Jun. 12, 2012

(54) METHOD OF MANUFACTURING A SEMICONDUCTOR DEVICE

(75) Inventors: Yuichi Urano, Matsumoto (JP);
Takayasu Horasawa, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 122 days.

(21) Appl. No.: 12/659,816

(22) Filed: Mar. 22, 2010

(65) Prior Publication Data

US 2010/0240213 A1 Sep. 23, 2010

(30) Foreign Application Priority Data

Mar. 23, 2009 (JP) ................................ 2009-069287

(51) Int. Cl.
*H01L 21/00* (2006.01)

(52) U.S. Cl. ............ 438/9; 438/706; 438/745; 438/197; 257/E21.006; 257/E21.042; 257/E21.051; 257/E21.081; 257/E21.082; 257/E21.169; 257/E21.229; 257/E21.311

(58) Field of Classification Search .............. 438/9, 197, 438/683, 684, 685, 668, 678, 706, 745, 687, 438/770; 257/E21.006, E21.042, E21.051, 257/E21.081, E21.082, E21.169, E21.229, 257/E21.311, E21.513
See application file for complete search history.

(56) References Cited

U.S. PATENT DOCUMENTS

| | | | |
|---|---|---|---|
| 5,510,216 A * | 4/1996 | Calabrese et al. | 430/16 |
| 6,278,153 B1 * | 8/2001 | Kikuchi et al. | 257/310 |
| 7,732,330 B2 * | 6/2010 | Fujii | 438/678 |
| 7,862,860 B2 * | 1/2011 | Breen Carmichael et al. | 427/304 |
| 2004/0066610 A1 | 4/2004 | Miyachi et al. | |
| 2004/0253740 A1 | 12/2004 | Shalyt et al. | |
| 2005/0158979 A1 | 7/2005 | Momota et al. | |
| 2005/0170555 A1 | 8/2005 | Hirano et al. | |
| 2006/0182881 A1 * | 8/2006 | Montano et al. | 427/162 |

FOREIGN PATENT DOCUMENTS

| | | |
|---|---|---|
| JP | 2001-274191 A | 10/2001 |
| JP | 2002-110893 A | 4/2002 |
| JP | 2003-013246 A | 1/2003 |
| JP | 2003-096573 A | 4/2003 |
| JP | 2003-110064 A | 4/2003 |
| JP | 2004-104004 A | 4/2004 |

(Continued)

OTHER PUBLICATIONS

Takeshi Nakata et al., "Zincate treatment and Electroless Ni-P Plating on Al Single-Crystal Surface".

(Continued)

*Primary Examiner* — David Nhu
(74) *Attorney, Agent, or Firm* — Rabin & Berdo, P.C.

(57) ABSTRACT

A method of manufacturing a semiconductor device on a semiconductor substrate, includes the steps of forming a first metal film on a front surface of the semiconductor substrate; forming a second metal film on the surface of the first metal film; activating a surface of the second metal film to provide an activated surface; and forming a plated film on the activated surface by a wet plating method in a plating bath that includes a reducing agent that is oxidized during plating and that has a rate of oxidation, wherein the second metal film is a metal film mainly composed of a first substance that enhances the rate of oxidation of the reducing agent in the plating bath. Wet plating is preferably an electroless process.

17 Claims, 11 Drawing Sheets

FOREIGN PATENT DOCUMENTS

| | | |
|---|---|---|
| JP | 2004-221416 A | 8/2004 |
| JP | 2004-363518 A | 12/2004 |
| JP | 2005-019830 A | 1/2005 |
| JP | 2005-244165 A | 9/2005 |
| JP | 2006-005166 A | 1/2006 |
| JP | 2007-005368 A | 1/2007 |
| JP | 2007-019412 A | 1/2007 |
| JP | 2007-036211 A | 2/2007 |
| JP | 2007-517186 | 6/2007 |

OTHER PUBLICATIONS

Geunter Petzow, Metal Ceramics Plastics Etching, pp. 154-165.

* cited by examiner

FIG. 9

| PLATING FILM | REDUCING AGENT IN PLATING BATH |
|---|---|
| Ni | SODIUM PHOSPHINATE (SODIUM HYPOPHOSPHITE), DIMETHYLAMINE BORANE, HYDRAZINE, POTASSIUM TETRAHYDROBORATE (POTASSIUM BORON HYDRIDE) |
| Co | SODIUM PHOSPHINATE (SODIUM HYPOPHOSPHITE), DIMETHYLAMINE BORANE, HYDRAZINE, POTASSIUM TETRAHYDROBORATE (POTASSIUM BORON HYDRIDE) |
| Pd | SODIUM PHOSPHINATE (SODIUM HYPOPHOSPHITE), SODIUM PHOSPHONATE (SODIUM PHOSPHITE), POTASSIUM TETRAHYDROBORATE (POTASSIUM BORON HYDRIDE) |
| Cu | FORMALIN, DIMETHYLAMINE BORANE, POTASSIUM TETRAHYDROBORATE (POTASSIUM BORON HYDRIDE) |
| Ag | DIMETHYLAMINE BORANE, POTASSIUM TETRAHYDROBORATE (POTASSIUM BORON HYDRIDE) |
| Au | DIMETHYLAMINE BORANE, POTASSIUM TETRAHYDROBORATE (POTASSIUM BORON HYDRIDE) |
| Pt | HYDRAZINE, SODIUM TETRAHYDROBORATE (SODIUM BORON HYDRIDE) |
| Sn | TITANIUM TRICHLORIDE |

FIG. 10

| | ETCHING TARGET MATERIAL | ETCHING SOLUTION | ETCHING TIME |
|---|---|---|---|
| EX 1 | PURE Ni, HIGH Ni CONCENTRATION ALLOY, NiTi, NiCu | 65 wt% NITRIC ACID 50 mL<br>GLACIAL ACETIC ACID 50 mL | 5 - 30 sec |
| EX 2 | Ni, Ni-BASED ALLOY, NiCr | 65 wt% NITRIC ACID 80 mL<br>40 wt% HYDROFLUORIC ACID 3 mL | SEVERAL sec - SEVERAL min |
| EX 3 | PURE Ni, NiCu, NiFe | DISTILLED WATER 50 mL<br>COPPER SULFIDE 10 g<br>32 WT% HYDROCHLORIC ACID 50 mL | 5 - 10 sec |
| EX 4 | NiFe, NiCu, NiAg | DISTILLED WATER OR 96 wt% ETHANOL 20 - 100 mL<br>32 wt% HYDROCHLORIC ACID 2 - 25 mL<br>IRON (III) CHLORIDE 5 - 8 g | 5 - 60 sec |
| EX 5 | PURE Ni | DISTILLED WATER 100 mL<br>PEROXOSULFURIC ACID 10 g OR<br>DISTILLED WATER 100 mL<br>POTASSIUM CYANATE 10 g | 30 - 60 sec |
| EX 6 | NiZnAg, NiAg, NiCu, NiAlMo | A SOLUTION OF 1 TO 1 MIXTURE OF (DISTILLED WATER 100 mL + PEROXOSULFURIC ACID 10 g) AND (DISTILLED WATER 100 mL + POTASSIUM CYANATE 10 g)<br>3 wt% HYDROGEN PEROXIDE SEVERAL DROPS | SEVERAL sec - SEVERAL min |
| EX 7 | NiAl, MoNi, NiTi | 32 wt% HYDROCHLORIC ACID 100 mL<br>CHROMIUM (VI) OXIDE 0.1 - 1 g | SEVERAL sec - SEVERAL min |
| EX 8 | NiFe | SATURATED AQ SOLN OF AMMONIUM PEROXODISULFATE | SEVERAL sec - SEVERAL min |
| EX 9 | NiZn | 25 wt% AQUEOUS AMMONIA 85 mL<br>30 wt% HYDROGEN PEROXIDE 5 mL | 5 - 15 sec |
| EX 10 | NiCu | 96 wt% ETHANOL 40 - 80 mL<br>32 wt% HYDROCHLORIC ACID 40 mL<br>IRON (III) CHLORIDE 2 g | SEVERAL sec - SEVERAL min |
| EX 11 | NiFe, NiAl | 32 wt% HYDROCHLORIC ACID 40 mL<br>65 wt% NITRIC ACID 30 mL<br>87 wt% GLYCEROL 10 mL<br>GLACIAL ACETIC ACID 20 mL | SEVERAL sec - SEVERAL min |
| EX 12 | Ni SILICIDE | DISTILLED WATER 80 mL<br>65 wt% NITRIC ACID 30 mL<br>40 wt% HYDROFLUORIC ACID 10 mL | SEVERAL sec - SEVERAL min |
| EX 13 | NiTi | DISTILLED WATER 100 mL<br>65 wt% NITRIC ACID 25 mL<br>40 wt% HYDROFLUORIC ACID 10 mL | 5 - 30 sec |
| EX 14 | Ni-BASED ALLOY CONTAINING AT LEAST 9 AT% OF Mo | DISTILLED WATER 50 mL<br>HYDROGEN AMMONIUM DISULFIDE 7g<br>32 wt% HYDROCHLORIC ACID 50 mL<br>POTASSIUM DISULFIDE 0.5 g | 5 - 10 min<br>30 - 40 °C |

EX 1 etc. MEANS EXAMPLE 1 etc.
NiTi etc. MEANS AN ALLOY OF Ni AND Ti etc.

METHOD OF MANUFACTURING A SEMICONDUCTOR DEVICE

CROSS-REFERENCE TO RELATED APPLICATION

This application is based on and claims priority from Japanese Patent Application No. 2009-069287 filed on Mar. 23, 2009, the contents of which are incorporated herein by reference.

BACKGROUND OF THE INVENTION

1. Field of the Invention

The present invention relates to a method of manufacturing a semiconductor device, in particular to a method of manufacturing a power semiconductor device for use in power converter devices and having electrodes on a front surface and a rear surface thereof with a thickness of the semiconductor device in the range of 80 to 200 μm.

2. Description of the Related Art

An IGBT (an insulated gate bipolar transistor), a type of power semiconductor device, is a one-chip power device that exhibits a high speed switching characteristic and a voltage driving characteristic, which are possessed by a MOSFET (a metal oxide semiconductor field effect transistor), and a low on-voltage characteristic, which is possessed by a bipolar transistor. The application field of IGBTs is expanding from the industry field including general purpose inverters, AC servo devices, uninterrupted power supplies (UPSs), and switching power supplies, to home appliances including microwave ovens, electric rice cookers, and strobes. IGBTs with new chip structures and lower on-voltage have been developed for application devices aiming at low losses and high efficiency.

There are some types of structures of an IGBT including a punch-through type (abbreviated to "PT" type in the following description), a non punch-through type (abbreviated to an "NPT" type in the following description), and a field stop type (abbreviated to an "FS" type in the following description). Except for some special applications, the main stream structure is an n channel type vertical double diffusion structure. Accordingly, this specification describes the main stream structure of the n channel type IGBT. The description is, however, valid for p-channel type IGBTs as well.

A PT type IGBT is formed using an epitaxial substrate in which an n+ buffer layer and an n− active layer are epitaxially grown on a p+ semiconductor substrate. As a result, a semiconductor device for a withstand voltage of 600 V class has a rather large total thickness of 200 to 300 μm including the p+ semiconductor substrate portion, although an active layer is sufficient with a thickness of about 100 μm. In addition, the PT type IGBT is relatively expensive because of the use of an epitaxial substrate.

Accordingly, IGBTs of an NPT type and an FS type have been developed using in place of the epitaxial substrate, an FZ substrate (a floating zone substrate) that is cut out of a semiconductor ingot manufactured by a floating zone method, intending cost reduction of the IGBT. These types of IGBTs have a low dose, shallow p+ collector layer (a low injection p+ collector) formed on the rear surface of the semiconductor device.

FIG. 11 is a sectional view showing a structure of an NPT type IGBT manufactured using an FZ substrate. Referring to FIG. 11, the NPT type IGBT has an active layer of an n− type semiconductor substrate 1, for example. A p+ base region 2 and an n+ emitter region 3 are selectively formed in the front surface layer of the n− semiconductor substrate 1. A gate electrode 5 is formed on the surface of the n− semiconductor substrate 1 through a gate oxide film 4. An emitter electrode 6 is made in contact with the n+ emitter region 3 and the p+ base region 2 and insulated from the gate electrode 5 with an interlayer dielectric film 7. On the rear surface of the n− semiconductor substrate 1, a p+ collector layer 8 and a collector electrode 9 are formed. The emitter electrode 6 and the collector electrode 9 are formed by evaporating or sputtering a metal such as aluminum, for example.

The NPT type IGBT has a total thickness of a substrate much thinner than that of the PT type IGBT. The NPT type IGBT performs high speed switching without lifetime control because a hole injection rate can be controlled. In addition, the NPT type IGBT is less expensive as compared with the PT type IGBT since the NPT type IGBT is manufactured using an FZ substrate in place of the epitaxial substrate.

FIG. 12 is a sectional view showing a structure of an FS type IGBT. As shown in FIG. 12, the front surface structure of the semiconductor substrate is as same as that of the NPT type IGBT shown in FIG. 11. In the rear surface side of the n− semiconductor substrate 1, an n buffer layer 10 is provided between the n− semiconductor substrate 1 and the p+collector layer 8. The FS type IGBT has a total thickness of the substrate of 80 to 200 μm owing to use of an FZ substrate. Because of depletion in the active layer of n− semiconductor substrate 1 like in the PT type IGBT, a thickness of the n− type semiconductor substrate 1 is about 100 μm for a semiconductor device of a withstand voltage of 600 V. Lifetime control is unnecessary like in the NPT type IGBT. Recently, in order to further reduce the on-voltage, a type of IGBT has been proposed having a structure in which the FS type structure is combined with a trench structure having a narrow and deep groove formed in the surface region of the chip and a MOSFET structure formed in the side region of the groove.

A method of manufacturing the semiconductor device as described above has been disclosed in Japanese Unexamined Patent Application Publication No. 2007-036211, for example, as follows. A front surface structure of a semiconductor element is formed in the first major surface region of a silicon substrate. After reducing the thickness of the substrate by grinding the second major surface, a buffer layer and a collector layer are formed on the second principal surface side. Then on the surface of the collector layer, an aluminum-silicon film is formed having a thickness in the range of 0.3 μm to 1.0 μm with a silicon concentration in the range of 0.5 wt % to 2.0 wt %, preferably not larger than 1.0 wt %. Following formation of the aluminum-silicon film, a collector electrode is formed by depositing a plurality of metal films of titanium, nickel, and gold by means of evaporation or sputtering. The titanium film, the nickel film, and the gold film are a buffer metal film, a soldering metal film, and a protective metal film, respectively.

A rear surface electrode such as a collector electrode is joined using a solder in packaging a semiconductor device. A front surface electrode such as an emitter electrode, on the other hand, is joined mostly employing a wire bonding technique using aluminum wires. Recently, however, the front surface electrode is occasionally joined also by means of soldering. Employment of the soldering for joining the front surface electrode achieves great deal of improvement in high density packaging, high current density, wiring capacitance reduction for high switching speed, and high cooling efficiency of the semiconductor device.

Japanese Unexamined Patent Application Publication No. 2002-110893 discloses a semiconductor device packaged by means of soldering as follows. An E heat sink is bonded with a solder to the front surface of the semiconductor chips. A second conductor member is bonded to the rear surfaces of the semiconductor chips with a solder, and a third conductor member is bonded to the front surface of the E heat sink with a solder. The E heat sink is provided with a step part to form a thin part. The bonding area between the E heat sink and the third conductor member is smaller than the one between the E heat sink and the semiconductor chips. The respective members are sealed with a resin so that the rear surface of the second conductor member and the front surface of the third conductor member are exposed.

A semiconductor device disclosed in Japanese Unexamined Patent Application Publication No. 2003-110064 comprises a semiconductor element, a first metallic body joined to the rear surface of the semiconductor element and functioning as an electrode and a heat removal member, a second metallic body joined to the front surface of the semiconductor element and functioning as an electrode and a heat removal member, and a third metallic body joined between the front surface of the semiconductor element and the second metallic body. Almost entire semiconductor device is molded with a resin. The thickness of the semiconductor element is made thin so as to reduce the shear stress on the surface of the semiconductor element or to decrease strain component in the joining layers between the semiconductor element and the metallic bodies. The whole semiconductor device is restrained and held with the mould resin. The joining layers are composed of a tin-based solder.

In an actual process of soldering on the front surface electrode, the surface of the front surface electrode needs to be plated with nickel, for example. Commonly employed plating methods are an electroplating method and an electroless plating method. In the electroplating method, metallic ions in the solution are reduced and precipitated by supplying an external electric current. In the electroless plating method, on the other hand, the metallic ions in the solution are chemically reduced and precipitated without using electricity. Consequently, the plating process by means of the electroless plating method can be conducted by a simpler manufacturing apparatus and in a simpler manufacturing process than the electroplating method, which needs an electric circuit including a counter electrode and a dc power supply.

Japanese Unexamined Patent Application Publication No. 2003-096573 discloses a plating process for plating on an electrode surface by means of an electroless plating method, as follows. The method for forming an electroless plated film on pad electrodes of a semiconductor substrate comprises a step of selectively activating the pad electrodes, and a step of immersing the semiconductor substrate in an electroless plating solution and simultaneously precipitating an electroless plated film while supplying a voltage on the semiconductor substrate by an external power supply. The step for activating is either one of a catalyst adding method or a zinc immersion process.

Japanese Unexamined Patent Application Publication No. 2007-019412 discloses another method. An interlayer dielectric film is provided on a semiconductor substrate in which a semiconductor element is formed. A plurality of recessed parts are provided on the surface of a first front surface electrode formed on the interlayer dielectric film corresponding to the configuration of contact holes. The surface of a first rear surface electrode is made uneven by an etching process. As a result, the difference between the surface area of the first front surface electrode and the surface area of the first rear surface electrode is made small. A second front surface electrode and a second rear surface electrode are simultaneously formed on the first front surface electrode and the first rear surface electrode, respectively, by means of a wet plating method. Specifically, the front and rear surfaces of the wafer are simultaneously plated with nickel. Through this process, the second front surface electrode is formed on the front surface side of the wafer and the second rear surface electrode is formed on the rear surface side of the wafer. Then, plated layers are formed simultaneously on the front and rear surfaces of the wafer by means of a wet plating method. Thus, plated layers of gold, for example, are formed on the surface of the second front surface electrode and on the surface of the second rear surface electrode.

In the electroless plating process on the front surface electrode, the surface of the front surface electrode needs to be activated to enhance adhesiveness between the front surface electrode and the plated film because a passive film is formed on the surface of the aluminum electrode and it is difficult to form a plated film having high adhesiveness. A zincate process is known as a method for improving adhesiveness between the front surface electrode and the plated film (see, for example, Japanese Unexamined Patent Application Publication No. 2003-096573 and Japanese Unexamined Patent Application Publication No. 2003-013246).

The following describes a process of plating including the zincating process as a pre-treatment for an electroless plating process. FIG. 13 is a flow chart showing a plating process in a conventional method of manufacturing a semiconductor device. This plating process is conducted on the surface of a front surface electrode composed of an aluminum alloy, for example. A sodium phosphinate (sodium hypophosphite), for example, is used for a reducing agent of a plating bath. First, a degreasing treatment, a step S21, is conducted as shown in FIG. 13. The step 21 removes oil, fat, and foreign matter adhered on the surface of the front surface electrode. At the same time, the step 21 improves wettability of an etching solution for the following step with the surface of the front surface electrode. The degreasing treatment generally uses an alkali solution. An example of the alkali solution can be, for example, a solution containing 20 to 30 $g/dm^3$ of sodium hydroxide (NaOH), 20 to 30 $g/dm^3$ of sodium carbonate ($Na_2CO_3$), 20 to 30 $g/dm^3$ of trisodium phosphate ($Na_3PO_4$), and 1 to 2 $g/dm^3$ of surfactant (NaOH).

Then, an etching treatment is conducted in step S22 using an acidic solution or an alkaline solution. The step S22 removes a natural oxide film on the surface of the front surface electrode. Then, in step S23, acid cleaning is conducted using nitric acid ($HNO_3$). The step S23 removes impurities (debris) in the surface of the front surface electrode generated in the preceding step of the etching process. Then, in step S24, a first zincate process is conducted. The step 24 substitutes zinc for the aluminum on the front surface electrode, producing a zinc film on the surface of the front surface electrode. Then, in step S25, acid cleaning is conducted using nitric acid. The step S25 removes the zinc film formed on the surface of the front surface electrode. Then, in step S26, a second zincate process is conducted. The step S26 produces again a zinc film on the surface of the front surface electrode.

Then, in step S27, a nickel plated film is formed by an electroless plating process. In the step S27, a mild substitution reaction occurs between the nickel ions in the electroless plating bath and the zinc film on the surface of the front surface electrode. A nickel plated film is formed on the surface of the front surface electrode by an oxidation-reduction reaction between the nickel ions in the plating bath and the reducing agent of sodium hypophosphite. A formula of the oxidation-reduction reaction in this process will be described afterwards. Then, in step S28, a substituted gold film is formed by an electroless plating process. In step S28, a substituted gold plated film is formed on the surface of the nickel plated film by reduction reaction of nickel of the nickel plated film and gold ions in the substituting gold plating bath. In the plating procedure shown in FIG. 13, a washing process with water on the surface of the front surface electrode intervenes between a step and a subsequent step.

In the case using sodium hypophosphite for a reducing agent, the reaction formulas of the electroless nickel plating of step S27 are represented by the following formulas (1), (2) and (3).

$$H_2PO_2^- + H_2O \rightarrow H_2PO_3^- + 2H^+ + 2e^- \quad (1)$$

$$Ni^{2+} + 2e^- \rightarrow Ni \quad (2)$$

$$H_2PO_2^- + 2H^+ + e^- \rightarrow 2H_2O + P \quad (3)$$

Formula (1) represents an oxidation reaction of the reducing agent. Formula (2) represents a reduction reaction of the nickel ions in the plating bath. Formula (3) represents a reaction that precipitates phosphorus that occurs simultaneously with the reaction of Formula (2).

However, through extensive research made by the inventors of the present invention, it has been found anew that the plated film formed by the plating procedure of FIG. 13 may cause performance variations in the semiconductor devices. One of the reasons for these performance variations of the semiconductor devices can be attributed to a phenomenon in which a hole (also referred to as a etch pit in the following description) reaching the surface of the semiconductor substrate 1 is formed in a part of the emitter electrode 6 by dissolution of aluminum in the emitter electrode 6.

FIG. 14 is a sectional view illustrating a front surface electrode in a normal state in a conventional method of manufacturing a semiconductor device, and FIG. 15 is a sectional view illustrating a front surface electrode in an abnormal state in a conventional method of manufacturing a semiconductor device. A semiconductor device manufactured through a normally conducted plating process as shown in FIG. 14 has a nickel plated film 11 and a substituted gold film (omitted in the figure) successively deposited on the surface of the emitter electrode 6. The other structures are the same as those of the semiconductor device shown in FIG. 12. Thus, the nickel plated film 11 is formed on the emitter electrode 6 and not in contact with the semiconductor substrate 1.

In contrast, when a etch pit 20 is generated in the emitter electrode 6 as shown in FIG. 15, the nickel plated film 11 comes in contact with the semiconductor substrate 1. The etch pit 20 can be presumed to be generated in the etching process (step S23 in FIG. 13) on the emitter electrode 6 after removing a surface oxide film, the etching process being a pre-treatment for the electroless plating process (step S27 in FIG. 13). The etch pit 20 may be also produced in the zincate process (step S24 to step S26 in FIG. 13) on the surface of the emitter electrode 6.

A description is first made about the emitter electrode 6 made by the etching process after removing the surface oxide film. Aluminum, the major component of the emitter electrode 6, has generally a surface oxide film exhibiting excellent corrosion resistance. The surface oxide film exhibits firm corrosion resistance against acid and alkali. When the surface oxide film is removed, the surface of the emitter electrode 6 becomes in a condition with extremely poor corrosion resistance against acid and alkali. When an etching process is conducted in that condition on the surface of the emitter electrode 6 using acid or alkali, the etching proceeds very fast. In addition, the speed of etching process differs depending on the crystal orientation. Etching on the (111) plane of the emitter electrode 6 proceeds faster than on the (110) plane and (100) plane of the emitter electrode 6. Consequently, at some spots on the surface of the electrode 6, the etching proceeds much faster than other places. This difference in etching speed can form recessed spots reaching the surface of the semiconductor substrate 1 in the emitter electrode 6. Thus, the etch pit 20 is generated in the emitter electrode 6.

Next, a description is made about an emitter electrode 6 undergone by the zincate process. Takeshi Nakata et al. report, in the article entitled "Zincate Treatment and Electroless Ni—P Plating on Al Single Crystal Surface" in the journal "Hyoumen Gijutu" (Surface Technology) Vol. 48, No. 8, p. 820-825 (1997), that the precipitation density of zinc on the aluminum surface in the zincate process of aluminum is higher on the (111) plane of aluminum than on (100) plane and (110) plane of aluminum. So, in substitution of zinc for aluminum in (100) plane and (110) plane, precipitation of zinc cannot follow the fast dissolution of aluminum. An emitter electrode 6 with a major component of aluminum involves a possibility that zinc does not precipitate on the surface of the emitter electrode 6 and local etching of aluminum progresses. In this way, an etch pit 20 is generated in the emitter electrode 6.

When an electroless plating process is conducted on a semiconductor device when the electrode 6 has an etch pit generated therein as shown in FIG. 15, the nickel plated film 11 comes in contact with the semiconductor substrate 1 at the etch pit 20. A common electroless plating bath contains an alkali metal such as sodium. The alkali metal may remain at the interface between the nickel plated film 11 and the semiconductor substrate 1 in a semiconductor device having an etch pit 20. The alkali metal remained at the interface between the nickel plated film 11 and the semiconductor substrate 1 diffuses to the gate oxide film 4 in a heat treatment, such as soldering in the packaging process of a semiconductor device, varying the characteristics of the semiconductor device.

SUMMARY OF THE INVENTION

In order to cope with the above conditions in the conventional technology, it is an object of the present invention to provide a method of manufacturing a semiconductor device that prevents the semiconductor device from having performance variation.

For solving the above-described conditions and accomplishing the object, a method of manufacturing a semiconductor device on a semiconductor substrate is provided comprising the steps of forming a first metal film on a front surface of the semiconductor substrate; forming a second metal film on the surface of the first metal film; activating a surface of the second metal film to provide an activated surface; and forming a plated film on the activated surface by a wet plating method in a plating bath that includes a reducing agent that is oxidized during plating and that has a rate of oxidation, wherein the second metal film is a metal film mainly composed of a first substance that enhances the rate of oxidation of the reducing agent in the plating bath. The method is the one for manufacturing a semiconductor device that has a front surface electrode on the surface of a semiconductor substrate.

The method of manufacturing a semiconductor device of the invention further comprises forming a pattern in the second metal film by an etching process prior to activating the surface of the second metal film; and forming a pattern in the first metal film by an etching process after the pattern in the second metal film is formed and prior to activating the surface of the second metal film.

The method of manufacturing a semiconductor device of the invention further comprises forming a pattern in the first metal film by an etching process prior to forming the second metal film on the surface of the first metal film; and forming a pattern in the second metal film by an etching process after forming the second metal film and prior to activating the surface of the second metal film.

In the method of manufacturing a semiconductor device of the invention stated in the foregoing, activating the surface of the second metal layer includes removing a surface oxide film from the surface of the second metal film.

In the method of manufacturing a semiconductor device of the invention stated in the foregoing, forming the plated film includes forming a first plated film on the surface of the second metal film that is mainly composed of a second substance that enhances the rate of oxidation of the reducing agent in the plating bath.

In the method of manufacturing a semiconductor device of the invention stated in the foregoing, the second substance may be nickel.

The method of manufacturing a semiconductor device of the invention stated in the foregoing, forming the plated film further comprises forming a second plated film on the surface of the first plated film that is mainly composed of a third substance that brings about a substitution reaction for the first plated film.

In the method of manufacturing a semiconductor device of the invention stated in the foregoing, the third substance may be gold.

In the method of manufacturing a semiconductor device of the invention stated in the forgoing, the first metal film may be formed by one of an evaporation method or a sputtering method.

In the method of manufacturing a semiconductor device of the invention stated in the foregoing, the first metal film may be mainly composed of aluminum.

In the method of manufacturing a semiconductor device of the invention stated in the foregoing, the first metal film may be composed of an alloy of one of aluminum-silicon or aluminum-silicon-copper.

In the method of manufacturing a semiconductor device of the invention stated in the foregoing, the second metal film may be a laminated metal film formed by laminating a third metal film having a high melting point and a film mainly composed of the first substance in this order.

In the method of manufacturing a semiconductor device of the invention stated in the foregoing, the third metal film may be composed of a metal selected from the group consisting of titanium, molybdenum, chromium, cobalt, and tungsten.

In the method of manufacturing a semiconductor device of the invention stated in the foregoing, the first substance may be nickel.

In the method of manufacturing a semiconductor device of the invention stated in the foregoing, the wet plating method may be an electroless plating method.

The method may further comprise forming a rear surface electrode on the rear surface of the semiconductor substrate after forming the second metal film and before activating the surface of the second metal film, wherein the first metal film and the second metal film form a front surface electrode on the front surface of the semiconductor substrate, and wherein forming the plated film includes simultaneously forming plated films on the surface of the front surface electrode and on the surface of the rear surface electrode.

The method may further comprise reducing thickness of the semiconductor substrate to a value not larger than 200 µm by working the rear surface of the semiconductor substrate between forming the first metal film and forming the rear surface electrode.

In the inventions described above, the second metal film, which is the outermost surface of the front surface electrode, is formed with a main component of nickel, which enhances the rate of oxidation reaction of the reducing agent added to the plating bath. In addition, the surface of the front surface electrode is activated before the electroless plating process. Owing to these measures, the first plated film is continuously precipitated on the surface of the second metal film in the electroless plating process solely by an oxidation-reduction reaction between the second metal film and the reducing agent. Consequently, the procedure of the invention precludes the need in the conventional plating procedure for an etching process on the front surface electrode conducted for pre-treatment for the electroless plating process after removal of a surface oxide film, and the need for a zincating treatment on the surface of the front surface electrode. Thus, the etch pit (see FIG. 15) is prevented from generation in the first metal film, and variation of characteristics of the semiconductor device is avoided. These effects are obtained in application to the rear surface electrode of the semiconductor device.

A method of manufacturing a semiconductor device according to the present invention has the result of obviating variation of characteristics of a semiconductor device.

BRIEF DESCRIPTION OF THE DRAWINGS

FIG. 9 is a table showing combination of a plated film and a reducing agent in the plating bath in an embodiment of a method of manufacturing a semiconductor device according to the invention;

FIG. 10 is a table showing etching methods in an embodiment of a method of manufacturing a semiconductor device according to the invention;

DETAILED DESCRIPTION OF THE INVENTION

Now, some preferred embodiment examples of a method of manufacturing a semiconductor device according to the present invention and semiconductor devices manufactured by the method will be described in detail in the following with reference to the accompanying drawings. Throughout the description on all the embodiment examples and in all the accompanying drawings, the similar structures are given the same symbols and repeated description thereon is avoided.

Figure 1:
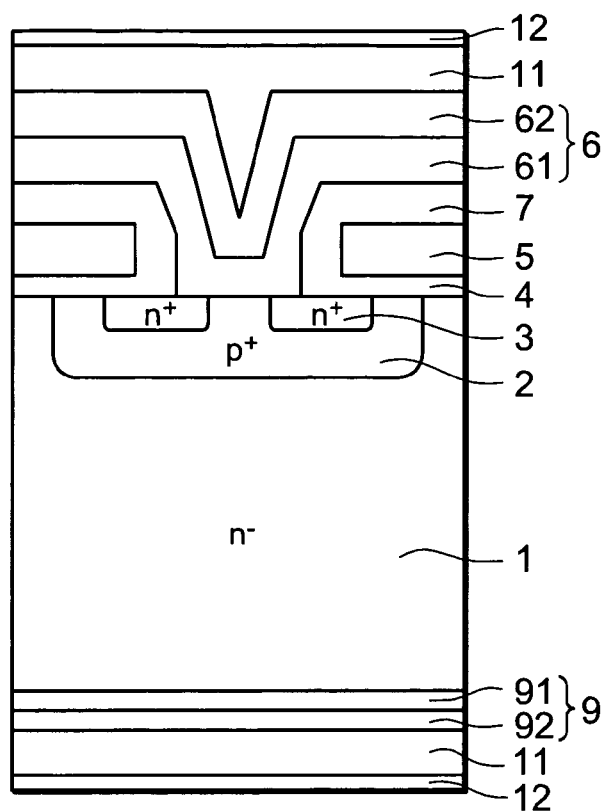
FIG. 1 is a sectional view showing a semiconductor device manufactured by an embodiment of a method of manufacturing a semiconductor device according to the invention.

FIG. 1 is a sectional view showing a semiconductor device manufactured by an embodiment of a method of manufacturing a semiconductor device according to the invention. Referring to FIG. 1, a p+ base region 2 is provided in a portion of a front surface layer of a semiconductor substrate 1 in the front surface side of the semiconductor device. An n+ emitter region 3 is selectively provided in a portion of the surface layer of the p+ base region 2. A gate electrode 5 is provided on a portion of the semiconductor substrate 1 through a gate oxide film 4. An emitter electrode 6 is made in contact with the p+ base region 2 and the n+ emitter region 3, and insulated from the gate electrode 5 with an interlayer dielectric film 7. The emitter electrode 6 is composed of a metal film of a main component of aluminum (referred to as a first aluminum film 61 in the following description) and a metal film of a main component of nickel (referred to as a first nickel film 62 in the following description) laminated in this order. On the surface of the first nickel film 62, a nickel plated film 11 and a substituted gold plated film 12 are laminated.

In the rear surface side of the semiconductor device, an n buffer layer and p+ collector layer are provided in a portion of the rear surface layer of the semiconductor substrate 1, though not shown in the figure. A collector electrode 9 is provided on the surface of the p+ collector layer. The collector electrode 9 is composed of a metal film of a main component of aluminum (referred to as a second aluminum film 91 in the following description) and a metal film of a main component of nickel (referred to as a second nickel film 92 in the following description) laminated in this order. On the surface of the second nickel film 92, a nickel plated layer 11 and a substituted gold plated film 12 are laminated. The emitter electrode 6 corresponds to a front surface electrode and the collector electrode 9 corresponds to a rear surface electrode. The first aluminum film 61 and the second aluminum film 91 correspond to first metal films. The first nickel film 62 and the second nickel film 92 correspond to second metal films. The nickel plated films 11 correspond to first plated films, and the substituted gold plated films 12 correspond to second plated films.

Figure 2:
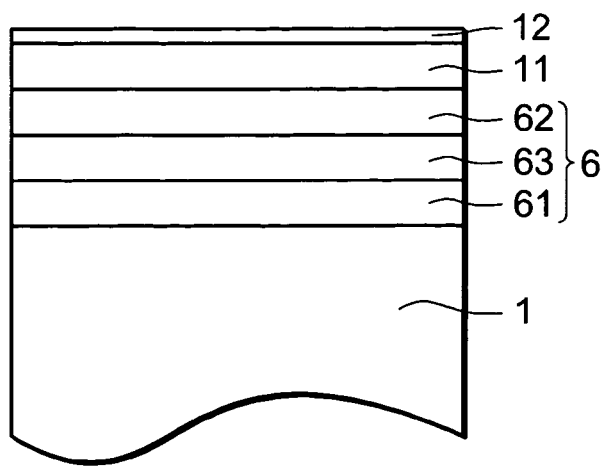
FIG. 2 is a sectional view showing another example of a front surface electrode in semiconductor device manufactured by an embodiment of a method of manufacturing a semiconductor device according to the invention.

FIG. 2 is a sectional view showing another example of a front surface electrode in a semiconductor device manufactured by an embodiment of a method of manufacturing a semiconductor device according to the invention. The semiconductor structures except for the electrodes are omitted in FIG. 2, which omission is followed by FIG. 3. The emitter electrode 6 can comprise a metal film of a main component of titanium (referred to as a first titanium film 63 in the following description) between the first aluminum film 61 and the first nickel film 62. The first titanium film 63 has a high melting point.

Figure 3:
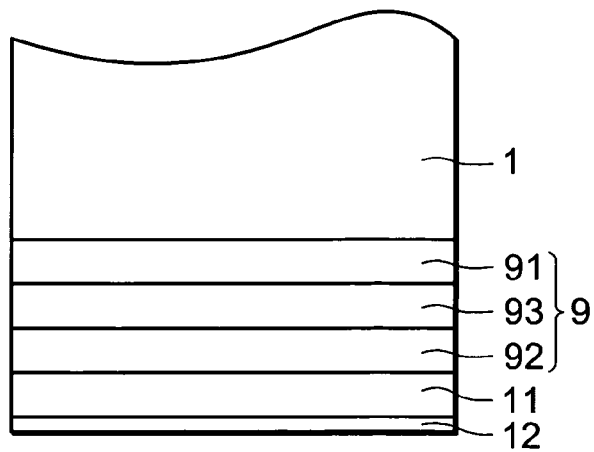
FIG. 3 is a sectional view showing another example of a rear surface electrode in semiconductor device manufactured by an embodiment of a method of manufacturing a semiconductor device according to the invention.

FIG. 3 is a sectional view showing another example of a rear surface electrode in a semiconductor device manufactured by an embodiment of a method of manufacturing a semiconductor device according to the invention. The collector electrode 9 can comprise a metal film of a main component of titanium (referred to as a second titanium film 93 in the following description) between the second aluminum film 91 and the second nickel film 92. The first titanium film 63 and the second titanium film 93 correspond to third metal film.

In the semiconductor devices shown in FIG. 1, FIG. 2, and FIG. 3, the first aluminum film 61 can be replaced by a metal film of aluminum-silicon (AlSi) or a metal film of aluminum-silicon-copper (AlSiCu). This is the same for the second aluminum film 91. The first titanium film 63 can be replaced by a metal film composed mainly of molybdenum, chromium, cobalt, or tungsten. This is the same for the second titanium film 93.

A metal film of aluminum-silicon formed for the second aluminum film 91 mitigate an adverse effect of aluminum spikes generated with substrate temperature rise in soldering in the packaging process. The effect of the aluminum-silicon is significant in a semiconductor device having an n buffer layer in the semiconductor substrate 1 with a thickness not larger than 1 µm. In such a structure, a thickness of the aluminum-silicon film can be about 0.5 µm, for example. A silicon concentration of the aluminum-silicon film is preferably 0.5 wt % to 2 wt %, more preferably at most 1.0 wt %.

Figure 4:
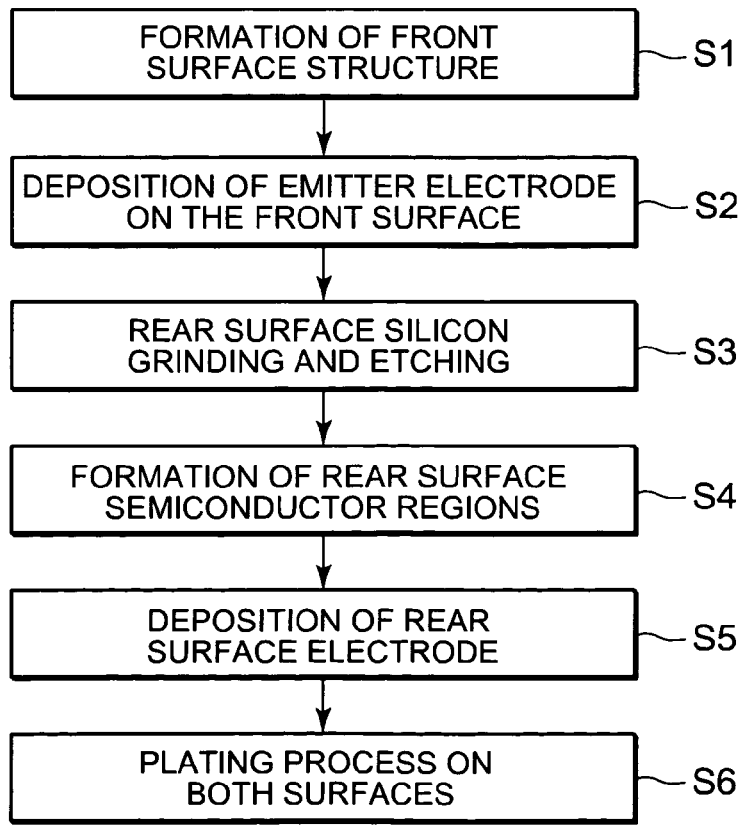
FIG. 4 is a flow chart showing a manufacturing procedure of a semiconductor device according to an embodiment of a method of the invention.

Next, description will be made on a method of manufacturing a semiconductor device. FIG. 4 is a flow chart showing a manufacturing procedure of a semiconductor device according to an embodiment of a method of the invention. Referring to FIG. 4, first in step S1, a front surface structure is formed in the front surface side of the semiconductor substrate 1. Then in step S2, an emitter electrode 6 is formed by successively depositing aluminum and nickel on the front surface of the semiconductor substrate 1 by means of an evaporation method or a sputtering method. Then in the step S2, the emitter electrode 6 is patterned. Then in step S3, the whole rear surface of the semiconductor substrate 1 is background and etched to reduce the thickness of the semiconductor substrate 1. Then in step S4, successive ion implantation of phosphorus and boron, for example, is conducted on the rear surface side of the semiconductor substrate 1 with a reduced thickness, and heat treatment is conducted. In this step S4, semiconductor regions including a buffer layer and a collector layer are formed. A natural oxide film on the surface of the collector layer is removed with diluted hydrofluoric acid (HF). After that, in step S5, aluminum-silicon and nickel are successively deposited on the surface of the collector layer by means of an evaporation method or a sputtering method to form a collector electrode 9. Then in step S6, an electroless plating process is conducted simultaneously on the surface of the emitter electrode 6 and the surface of the collector electrode 9 of the semiconductor substrate 1.

Figure 5:
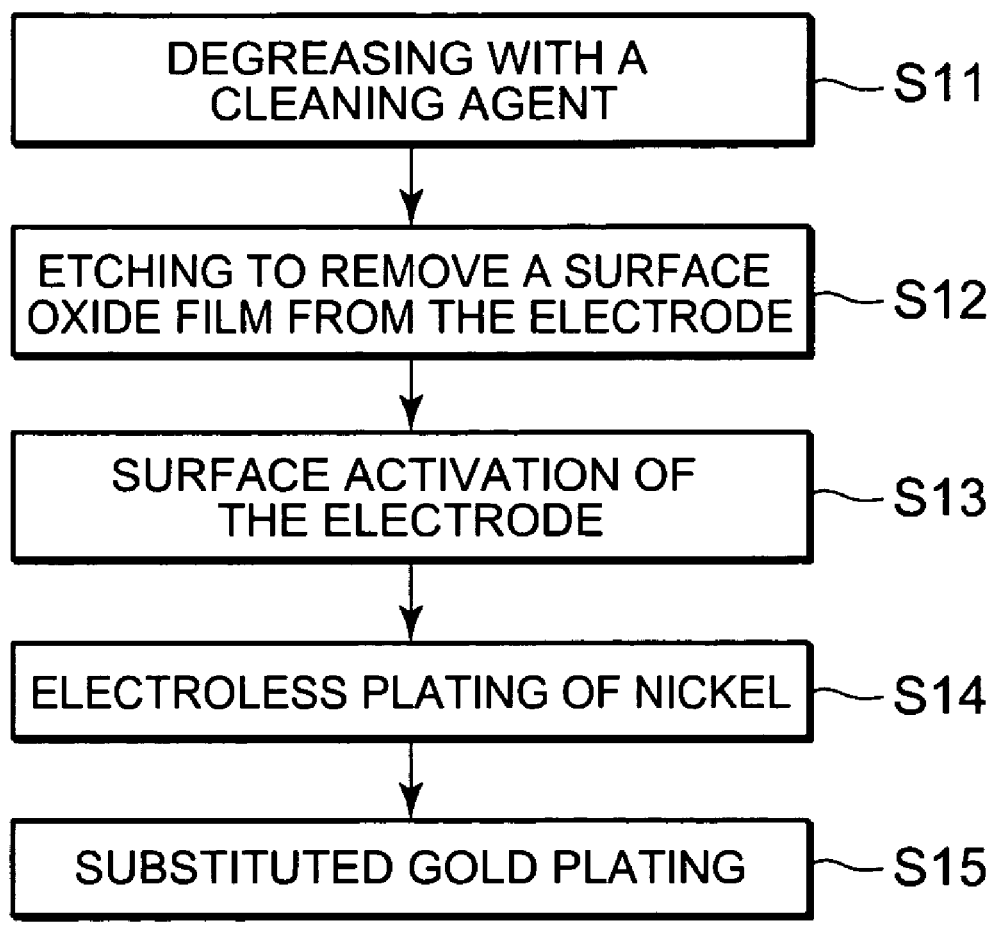
FIG. 5 is a flow chart showing a plating process in an embodiment of a method of manufacturing a semiconductor device according to the invention.

Description is made here about a method of the electroless plating process in the step S6. FIG. 5 is a flow chart showing a plating process in an embodiment of a method of manufacturing a semiconductor device according to the invention. Referring to FIG. 5, first in step S11, the surface of the emitter electrode 6 is degreased with a cleaning agent to enhance wettability with an etching solution. Then in step S12, a surface oxide film formed on the surface of the emitter electrode 6 is removed by etching. Then in step S13, the surface of the emitter electrode 6 is activated. Then in step S14, an electroless nickel plating process is conducted simultaneously on the surfaces of the emitter electrode 6 and the collector electrode 9 of the semiconductor substrate 1. Then in step S15, a substituted gold plating process is conducted simultaneously on the surfaces of the emitter electrode 6 and the collector electrode 9 of the semiconductor substrate 1 subsequently to the step S14. In the plating procedure shown in FIG. 5, a process of washing the semiconductor device with water intervenes between one treatment step and the next treatment step.

Figure 6:
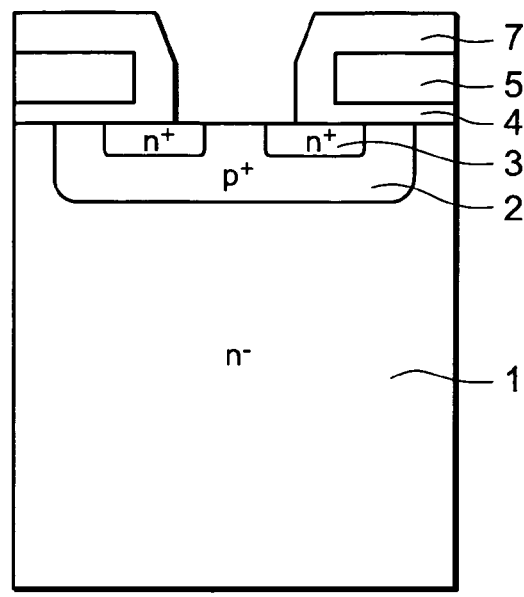
FIG. 6 is a sectional view showing a manufacturing process in an embodiment of a method of manufacturing a semiconductor device according to the invention.
Figure 7:
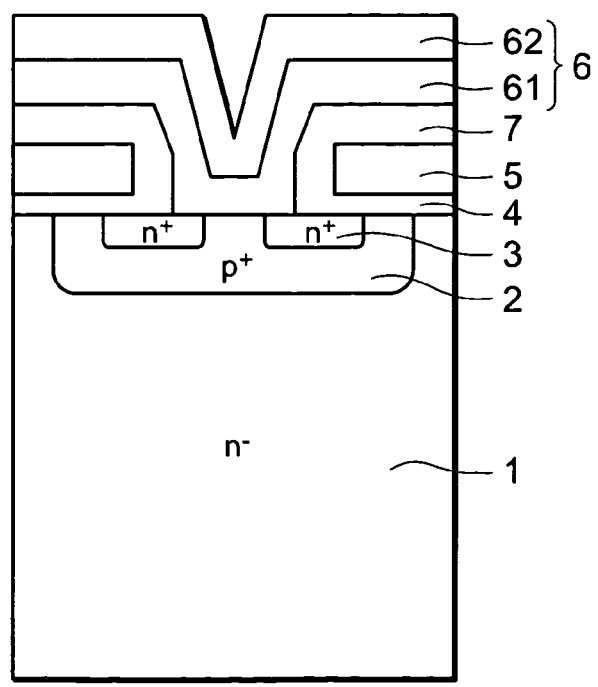
FIG. 7 is a sectional view showing a manufacturing process in an embodiment of a method of manufacturing a semiconductor device according to the invention.
Figure 8:
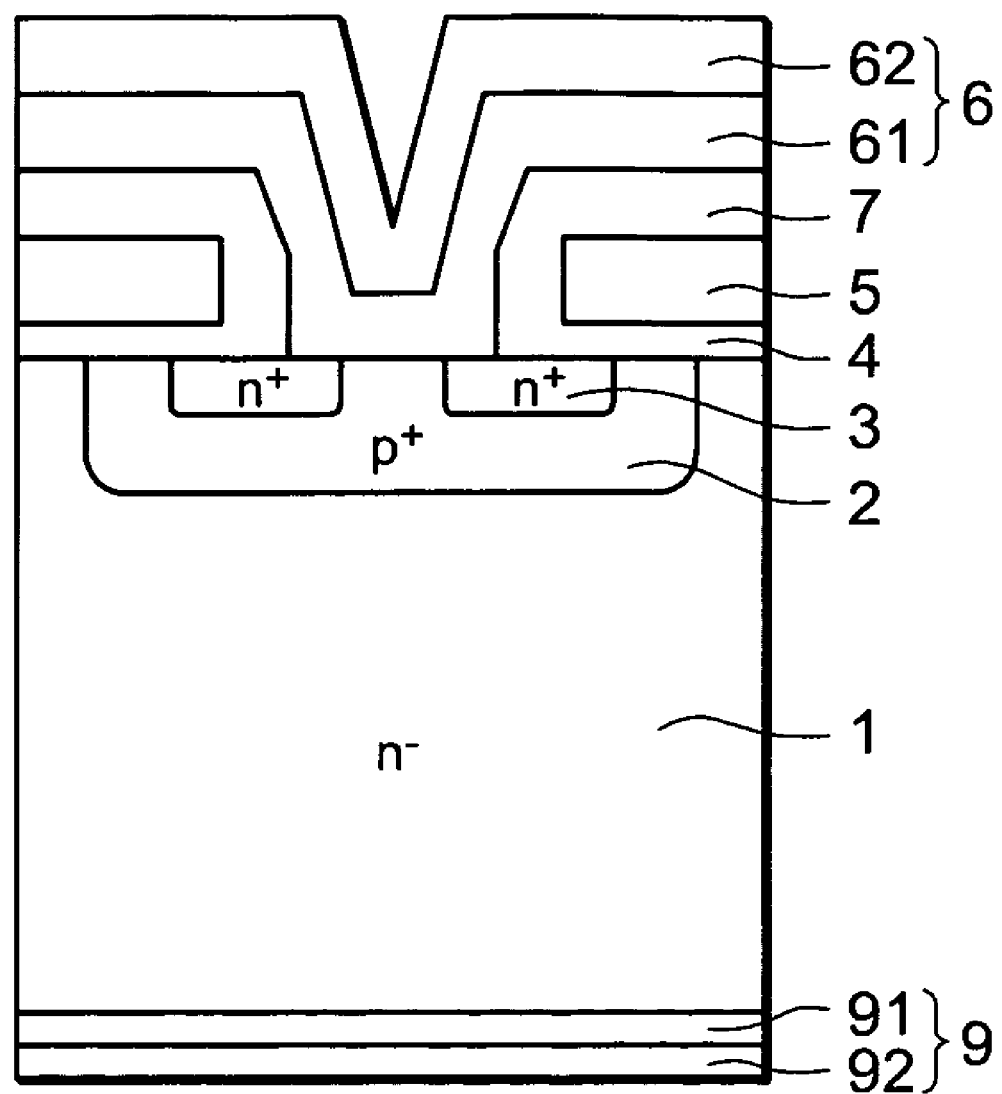
FIG. 8 is a sectional view showing a manufacturing process in an embodiment of a method of manufacturing a semiconductor device according to the invention.
Figure 11:
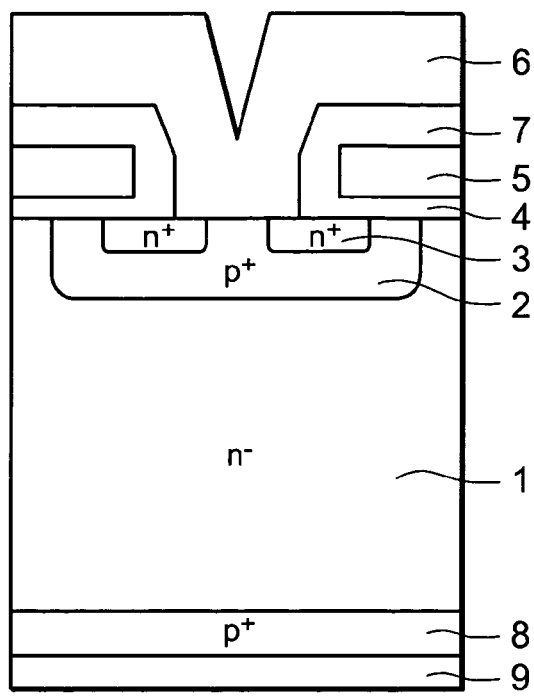
FIG. 11 is a sectional view of a structure of an NPT type IGBT.
Figure 12:
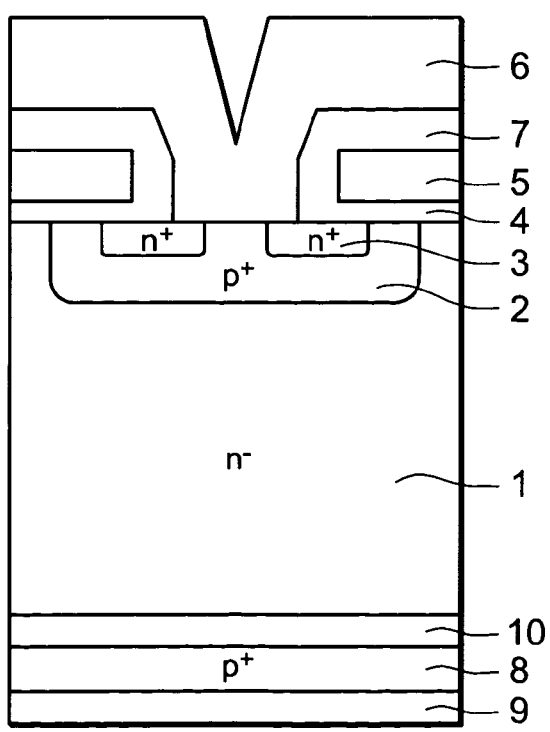
FIG. 12 is a sectional view of a structure of an FS type IGBT.
Figure 13:
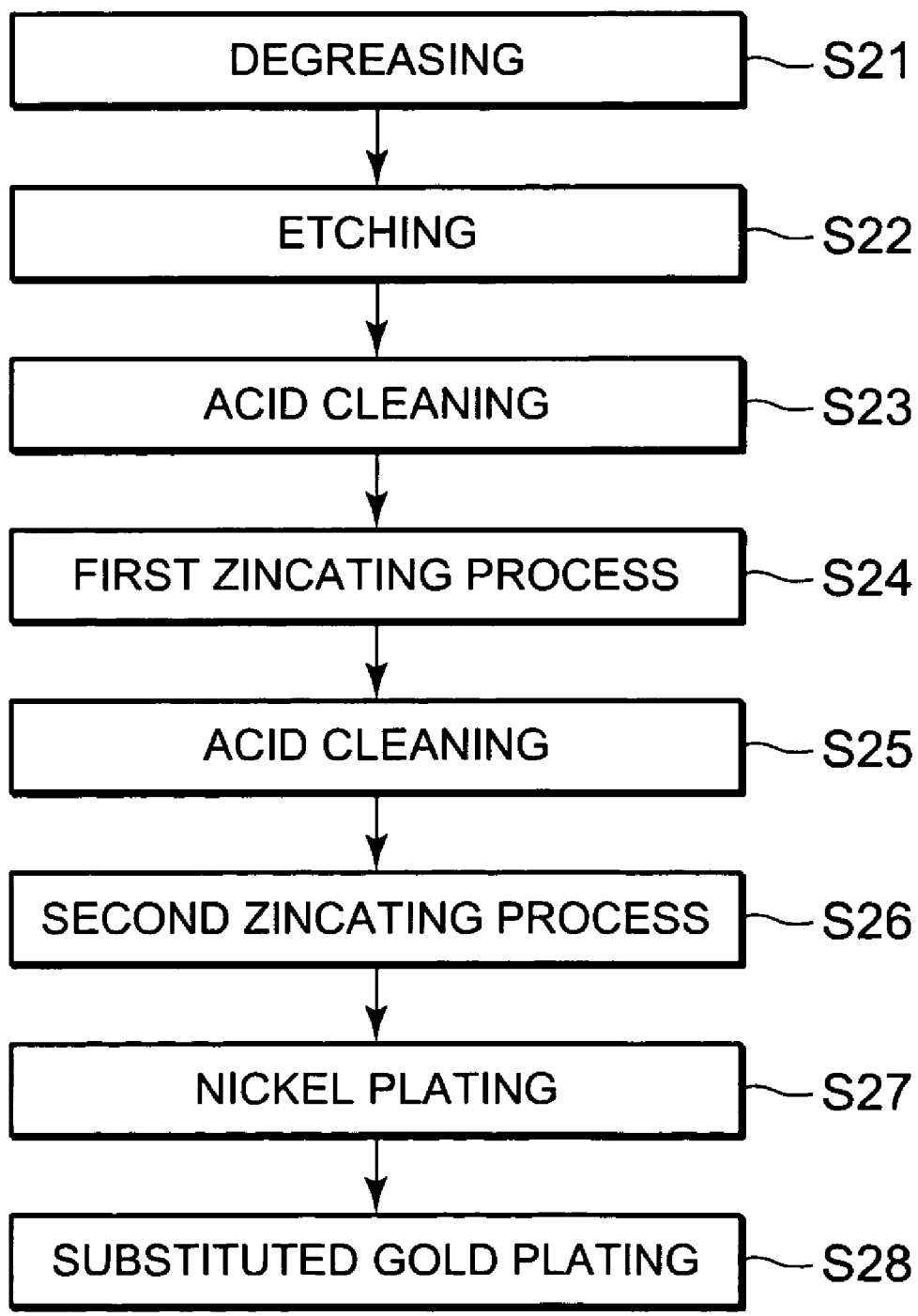
FIG. 13 is a flow chart showing a plating process in a conventional method of manufacturing a semiconductor device.
Figure 14:
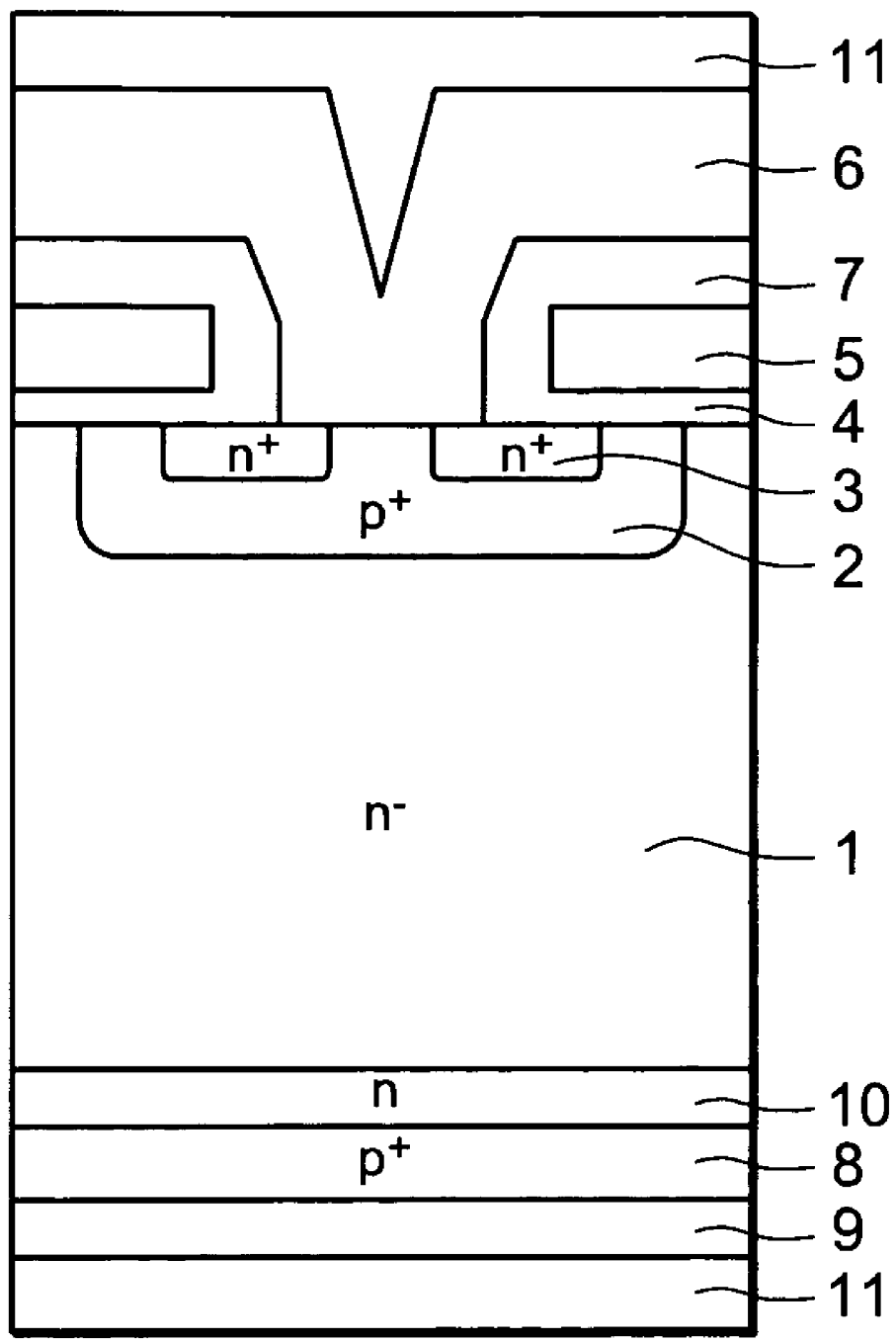
FIG. 14 is a sectional view of a front side electrode in a normal condition in a conventional method of manufacturing a semiconductor device.

FIG. 6, FIG. 7, and FIG. 8 are sectional views showing a manufacturing process in an embodiment of a method of manufacturing a semiconductor device according to the invention. In the step S1 described previously with reference to FIG. 4, the p+ base region 2 and the n+ emitter region 3 are formed in a portion of the surface layer side of the semiconductor substrate 1 as shown in FIG. 6. The gate oxide film 4, the gate electrode 5, and interlayer dielectric film 7 are formed on a portion of the surface of the semiconductor substrate 1. The interlayer dielectric film 7 is formed covering the gate electrode 5.

In the step S2 described previously, the emitter electrode 6 composed of the first aluminum film 61 and the first nickel film 62 is formed as shown in FIG. 7. The emitter electrode 6 is formed in contact with a part of the p+ base region 2 and a part of the n+ emitter region 3 and on the interlayer dielectric film 7. Thicknesses of the first aluminum film 61 and the first nickel film 62 can be, for example, 1.0 µm and 0.5 µm, respectively.

A patterning process on the emitter electrode 6 in the step S2 is carried out, after lamination of the first aluminum film 61 and the first nickel film 62, by etching the first nickel film 62 and the first aluminum film 61 in this order. Alternatively, after forming the first aluminum film 61, etching process is conducted on the first aluminum film 61. Subsequently on the surface of the patterned first aluminum film 61, the first nickel film 62 is formed followed by etching on the first nickel film 62. In the above-described processes, the first aluminum film 61 can be patterned by means of a dry etching process using a plasma etching apparatus introduced with boron trichloride (BCl$_3$) or chlorine gas (Cl$_2$), for example. As for the first nickel film 62, patterning can be carried out by means of a wet etching using an etching solution of a mixture of nitric acid and hydrofluoric acid. Etching conditions in the process of patterning the nickel film will be described afterwards.

In the steps S3 through S5, the rear surface side of the semiconductor substrate 1 is first back-ground to reduce the thickness of the semiconductor substrate 1 to a value not larger than 200 µm, for example 160 µm. The rear surface side of the semiconductor substrate 1 is further removed by 20 µm, for example, by means of an etching process. After that, a buffer layer and a collector layer (not shown in the figure) are formed in the rear surface side of the semiconductor substrate 1. Then, the collector electrode 9 composed of the second aluminum film 91 and the second nickel film 92 is formed on the rear surface of the semiconductor substrate 1. Thicknesses of the second aluminum film 91 and the second nickel film 92 can be for example, 0.5 µm and 0.7 µm, respectively. The etching process in the step S3 eliminates the damaged layer due to the back-grinding process. The etching process can be carried out by dry etching or spin etching.

The process in the step S3 for reducing the thickness of the semiconductor substrate down to a value not larger than 200 µm is not necessarily carried out in the order shown in FIG. 4. For example, the process for reducing the thickness of the semiconductor substrate 1 can be carried out after forming the first aluminum film 61 of the emitter electrode 6 and before depositing the first nickel film 62 of the emitter electrode 6. Thus, the processes of back-grinding and etching on the rear surface side of the semiconductor substrate 1 can be carried out in a midway of the step S2. The step S3 can be conducted, changing the sequence, at any time between the process of forming the first aluminum film 61 of the emitter electrode 6 and the process of forming the collector electrode 9 on the rear surface of the semiconductor substrate 1 in the step S5.

In the step S6, the nickel plated films 11 are formed simultaneously on the emitter electrode 6 and the collector electrode 9 as shown in FIG. 1. The substituted gold plated films 12 are formed on those nickel plated films 11. Thicknesses of the nickel plated film 11 and the substituted gold plated film 12 can be for example, 5 µm and 0.03 µm, respectively. In order to improve adhesiveness between the emitter electrode 6 and the nickel plated film 11 in the step S6, a process for activating the surface of the emitter electrode 6 (step S13) is conducted as a pre-treatment for the electroless nickel plating process.

The processes in the step S11 and the step S13 removes adhered matter on the surface of the first nickel film 62 and a degraded layer generated due to processing on the surface. The surface oxide film on the first nickel film 62 is removed and the surface of the emitter electrode 6 is activated. Through this process, adhesiveness between the emitter electrode 6 and the nickel plated film 11 is improved. The surface of the second nickel film 92 can be similarly treated to activate the surface of the collector electrode 9. Etching conditions in the process of removing the surface oxide film on the nickel film will be described afterwards.

In the step S14 and the step S15, an electroless nickel plating process and a substituted gold plating process are continuously conducted to form nickel plated films 11 and substituted gold plated films 12 simultaneously on the emitter electrode 6 and the collector electrode 9. A nickel plating bath can contain a reducing agent for example sodium hypophosphite. The reason for that will be described afterwards. Another example of a reducing agent to be added into the nickel plating bath will also be described afterwards. Through the above-described procedure, a semiconductor device as shown in FIG. 1 is completed.

When a first titanium film 63 is formed as shown in FIG. 2, aluminum, titanium, and nickel are successively deposited on the front surface of the semiconductor substrate 1 in step S2 by means of an evaporation method or a sputtering method. A thickness of the first titanium film 63 can be 0.5 µm, for example.

In the case the first titanium film 63 is formed, patterning of the films in the emitter electrode 6 can be carried out, after depositing the first aluminum film 61, the first titanium film 63, and the first nickel film 62 of the emitter electrode 6, by etching the first nickel film 62, the first titanium film 63, and the first aluminum film 61 in this order. Alternatively, the etching can be conducted, after depositing the first aluminum film 61 and the first titanium film 63, by etching the first titanium film 63 and the first aluminum film 61 in this order. Subsequently, the first nickel film 62 is formed and etched. In this case, etching conditions for patterning the first titanium film 63 can be the same as those for patterning the first aluminum film 61.

When a second titanium film 93 is formed as shown in FIG. 3, aluminum-silicon, titanium, and nickel are sequentially deposited on the rear surface of the semiconductor substrate 1 in step S5 by an evaporation method or a sputtering method. A thickness of the second titanium film 93 can be 0.2 µm, for example.

Provision of the first titanium film 63 in the emitter electrode 6 brings about an advantage to reduce a thickness of the first nickel film or the nickel plated film 11, or thicknesses of the both films. The reason for that is as follows. The nickel plated film 11 is provided in order to improve adhesiveness between the emitter electrode 6 and a solder in the soldering process. When a soldering process is conducted using a lead-free solder of SnAgCu system by a heat treatment at about 300° C., for example, an overall thickness including the first nickel film 62 and the nickel plated film 11 (referred to as a whole nickel film in the following description) needs at least 3 μm. The thickness of the whole nickel film, however, decreases to 0.3 to 2.0 μm by diffusion of the nickel into the solder in the heat treatment in the soldering process. If the whole nickel film become thin and the first aluminum film 61 exposes on the surface of the emitter electrode 6, the first aluminum film 61 comes in contact with the solder. Since the first aluminum film 61 exhibits poor adhesiveness with a solder, peeling off occurs at the interface between the emitter electrode 6 and the solder. When the first titanium film 63 intervenes between the whole nickel film and the first aluminum film 61, on the other hand, even if a pit is generated in the whole nickel film reaching the underlying layer, the first titanium film 6 exposes on the surface of the emitter electrode 6. Thus, the contact between the first aluminum film 61 and the solder is avoided. In addition, if the first titanium film 63, exhibiting good adhesiveness with the solder, exposes on the surface of the electrode 6, adhesiveness between the emitter electrode 6 and the solder is ensured. Therefore, adhesiveness between the emitter electrode and the solder is ensured even when the first nickel film 62 or the nickel plating layer 11 is made thin. The reasoning is true for the second titanium film 93 like for the first titanium film 63. The same effect is also obtained by forming a molybdenum film, a chromium film, a cobalt film, or a tungsten film in place of the titanium film.

Although the surface layer of the emitter electrode 6 to be plated is formed using nickel (the first nickel film 62), the nickel can be replaced by a substance (a first substance) that enhances an oxidation reaction rate of a reducing agent added in the electroless plating bath. Although the plating layer, the nickel plating layer 11, is formed by precipitating nickel on the surface of the emitter electrode 6, the substance precipitating on the surface of the emitter electrode 6 can be selected from substances (second substances) that enhance an oxidation reaction rate of a reducing agent added in the electroless plating bath. A preferred example is a combination of nickel, which is a main component of the first nickel film 62 and the nickel plated film 11, and sodium hypophosphite, which is a reducing agent in the plating bath. The first substance and the second substance can be different from each other.

FIG. 9 is a table showing combinations of a plated film and a reducing agent in the plating bath in an embodiment of a method of manufacturing a semiconductor device according to the invention. The following describes representative reducing agents in the electroless plating bath in the process of forming a plated film mainly composed of a second substance. As shown in FIG. 9, a reducing agent of the plating bath for forming a nickel plated film is preferably sodium phosphinate (sodium hypophosphite), dimethylamine borane, hydrazine, or potassium tetrahydroborate (potassium boron hydride). A reducing agent of the plating bath for forming a cobalt plated film is preferably sodium phosphinate (sodium hypophosphite), dimethylamine borane, hydrazine, or potassium tetrahydroborate (potassium boron hydride). A reducing agent of the plating bath for forming a palladium plated film is preferably sodium phosphinate (sodium hypophosphite), sodium phosphonate (sodium phosphite), or potassium tetrahydroborate (potassium boron hydride).

A reducing agent of the plating bath for forming a copper plated film is preferably formalin, dimethylamine borane, or potassium tetrahydroborate (potassium boron hydride). A reducing agent of the plating bath for forming a silver plated film is preferably dimethylamine borane or potassium tetrahydroborate (potassium boron hydride). A reducing agent of the plating bath for forming a gold plated film is preferably dimethylamine borane or potassium tetrahydroborate (potassium boron hydride). A reducing agent of the plating bath for forming a platinum plated film is preferably hydrazine, or sodium tetrahydroborate (sodium boron hydride). A reducing agent of the plating bath for forming a tin plated film is preferably titanium trichloride.

The substituted gold plated film 12 is provided for avoiding surface oxidation on the nickel plated film 11. The substituted gold plated film 12 is formed by substituting gold in the gold plating bath for nickel in the surface portion of the nickel plated film 11. The substituted gold plated film 12 can be replaced by a plated film mainly composed of a third substance that brings about a substitution reaction for the second substance for example, nickel, a main component of the nickel plated film 11.

Next, description is made here about etching conditions on the first nickel film 62. FIG. 10 is a table showing etching methods in an embodiment of a method of manufacturing a semiconductor device according to the invention. Etching conditions in the case of forming a pattern on the first nickel film 62 are shown in FIG. 10. FIG. 10 is based on a book "Manual for Metallography and Etching" by Günter Petzow, translated into Japanese by Y. Uchida and H. Uchida, page 160, published by Nikkan Kogyo Shinbun, Ltd. The table of FIG. 10 shows compositions of etching solution and etching conditions for etching the materials of Examples 1 through 14. The material of Example 1 is pure nickel with a purity of at least 99 at %, an alloy with a high nickel concentration, a nickel-titanium alloy (NiTi), or a nickel-copper alloy (NiCu). The composition of the etching solution for the material of Example 1 is a mixture of 50 mL of nitric acid with a concentration of 65 wt % and 50 mL of acetic acid (glacial acetic acid) with a purity of at least 98 at %. Etching time for Example 1 is 5 to 30 sec. The material of Example 2 is nickel, a nickel-based alloy, or a nickel-chromium alloy (NiCr). The composition of the etching solution for the material of Example 2 is a mixture of 80 mL of nitric acid with a concentration of 65 wt % and 3 mL of hydrofluoric acid with a concentration of 40 at %. The etching time for Example 2 is several seconds to several minutes.

The material of Example 3 is pure nickel, a nickel-copper alloy (NiCu), or a nickel-iron alloy (NiFe). The compositions of the etching solution for the material of Example 3 are distilled water 50 mL, copper sulfide 10 g, and 32 wt % hydrochloric acid 50 mL. The etching time for Example 3 is 5-10 sec. The material of Example 4 is an alloy of nickel-iron (NiFe), nickel-copper (NiCu), or nickel silver (NiAg). The compositions of the etching solution for the material of Example 4 are distilled water or 96 wt % ethanol 20-100 mL, 32 wt % hydrochloric acid 2-25 mL, and iron (III) chloride ($FeCl_3$) 5-8 g. The etching time for Example 4 is 5-60 sec. The material of Example 5 is pure Ni. The compositions of the etching solution for the material of Example 5 are distilled water 100 mL and peroxosulfuric acid 10 g, or distilled water 100 mL and potassium cyanate (KCN) 10 g. The etching time for Example 5 is 30-60 sec.

The material of Example 6 is an alloy of nickel-zinc-silver (NiZnAg), nickel-silver (NiAg), nickel-copper (NiCu), or nickel-aluminum-molybdenum (NiAlMo). The compositions of the etching solution for the material of Example 6 are a solution of 1 to 1 mixture of (distilled water 100 mL+peroxosulfuric acid 10 g) and (distilled water 100 mL+potassium cyanate (KCN) 10 g), and 3 wt % hydrogen peroxide ($H_2O_2$) several drops. The etching time for Example 6 is several sec-several min. The material of Example 7 is an alloy of nickel-aluminum (NiAl), molybdenum (MoNi), or nickel-titanium (NiTi). The compositions of the etching solution for the material of Example 7 are 32 wt % hydrochloric acid 100 mL, and chromium (VI) oxide 0.1-1 g. The etching time for Example 7 is several sec-several min.

The material of Example 8 is an alloy of nickel-iron (NiFe). The compositions of the etching solution for the material of Example 8 are saturated aqueous solution of ammonium peroxodisulfate. The etching time for Example 8 is several sec-several min. The material of Example 9 is an alloy of nickel-zinc (NiZn). The compositions of the etching solution for the material of Example 9 are 25 wt % aqueous ammonia ($NH_3$) 85 mL and 30 wt % hydrogen peroxide ($H_2O_2$) 5 mL. The etching time for Example 9 is 5-15 sec. The material of Example 10 is an alloy of nickel-copper (NiCu). The compositions of the etching solution for the material of Example 10 are 96 wt % ethanol 40-80 mL, 32 wt % hydrochloric acid 40 mL, and iron (III) chloride ($FeCl_3$) 2 g. The etching time for Example 10 is several sec-several min.

The material of Example 11 is an alloy of nickel-iron (NiFe) or nickel-aluminum (NiAl). The compositions of the etching solution for the material of Example 11 are 32 wt % hydrochloric acid 40 mL, 65 wt % nitric acid 30 mL, 87 wt % glycerol ($C3H5(OH)_3$) 10 mL, and glacial acetic acid 20 mL. The etching time for Example 11 is several sec-several min. The material of Example 12 is Ni silicide. The compositions of the etching solution for the material of Example 12 are distilled water 80 mL, 65 wt % nitric acid 30 mL, and 40 wt % hydrofluoric acid 10 mL. The etching time for Example 12 is several sec-several min. The material of Example 13 is an alloy of nickel-titanium (NiTi). The compositions of the etching solution for the material of Example 13 are distilled water 100 mL, 65 wt % nitric acid 25 mL, and 40 wt % hydrofluoric acid 10 mL. The etching time for Example 13 is 5-30 sec. The material of Example 14 is a Ni-based alloy containing at least 9 at % of molybdenum. The compositions of the etching solution for the material of Example 14 are distilled water 50 mL, hydrogen ammonium disulfide 7 g, 32 wt % hydrochloric acid 50 mL, and potassium disulfide 0.5 g. The etching time for Example 14 is 5-10 min. The temperature of the plating bath for Example 14 is 30-40° C.

The surface oxide film on the first nickel film 62 can also be removed by etching process using nitric acid with a concentration of 30 wt % for 30 seconds to 2 minutes. However, the etching can be performed by the shortened etching time in the etching conditions of FIG. 10. Etching conditions for the second nickel film 92 are similar to those for the first nickel film 62.

Figure 15:
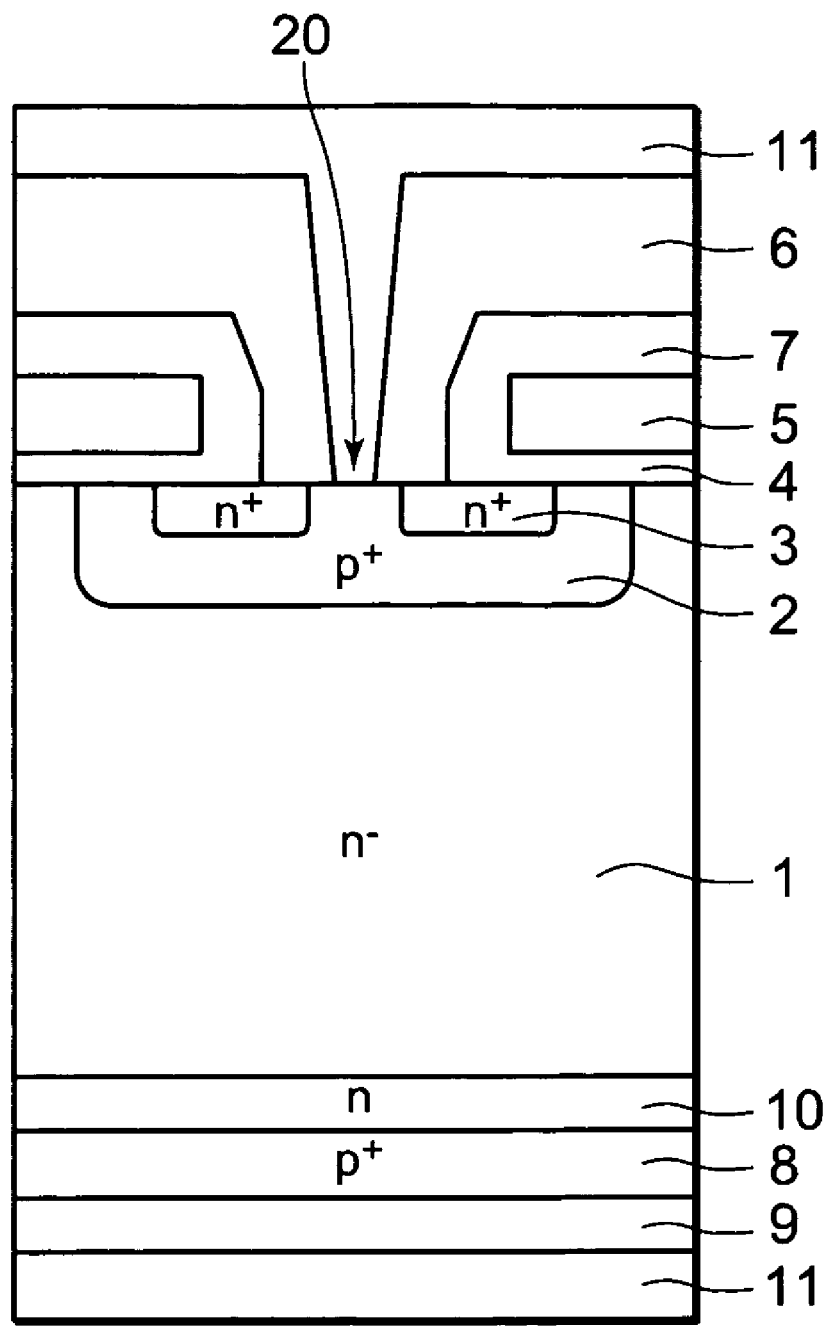
FIG. 15 is a sectional view of a front side electrode in an abnormal condition in a conventional method of manufacturing a semiconductor device.

In the embodiment described thus far, the first nickel film 62, which is the outermost layer of the emitter electrode 6, is formed of mainly nickel, which enhances the rate of oxidation reaction of the reducing agent added in the plating bath. In addition, the surface of the emitter electrode 6 is activated prior to the electroless plating process. Owing to these measures, the nickel plated film 11 is continuously precipitated on the surface of the first nickel film 62 in the electroless plating process solely by an oxidation-reduction reaction between the first nickel film 62 and the reducing agent. Consequently, the procedure of the invention precludes the needs in the conventional plating procedure for etching process on the emitter electrode 6 conducted for pre-treatment for the electroless plating process after removal of a surface oxide film, and need for a zincating treatment on the surface of the emitter electrode 6. Thus, the etch pit (see FIG. 15) is prevented from generation in the first aluminum film 62, and variation of characteristics of the semiconductor device is avoided. Because the number of steps is reduced as compared with the conventional plating process, the manufacturing costs are reduced. The above situation is same for the second nickel film 92. By providing the first titanium film 63 in the emitter electrode 6, even when an etch pit is generated in the first nickel film 62 and the nickel plated film 11 reaching the underlying layer in soldering in the packaging process, the first titanium film 63, which exhibits good adhesiveness with the solder, exposes on the surface of the emitter electrode 6, ensuring adhesiveness between the emitter electrode 6 and the solder. Therefore, the thicknesses of the first nickel film 62 and the nickel plated film 11 can be reduced. The same effect is obtained for the collector electrode 9. The nickel plated films 11 are formed simultaneously on the front surface electrode of emitter electrode 6 and on the rear surface electrode of collector electrode 9. As a consequence, the stress developed in the nickel plated film 11 formed on the emitter electrode 6 is cancelled by the stress developed in the nickel plated film 11 formed on the collector electrode 9. Therefore, a warping of the semiconductor substrate 1 is suppressed.

In the method of the invention, the structures of the front surface electrode and the rear surface electrode can be fabricated arbitrarily combining an electrode with the two-layer metal film structure shown in FIG. 1 and an electrode with the three-layer metal film structure shown in FIG. 2 and FIG. 3. The electrode structures including a thickness of each film can be selected corresponding to a structure, a thickness, manufacturing costs, and application target of the semiconductor device. The collector electrode 9 may be formed by a procedure other than the procedure of the embodiment of the invention.

Although the plating process is conducted simultaneously on the both surfaces of the semiconductor substrate in the above-described embodiment, the method of the invention is effective when the plating process is conducted solely on one surface of the substrate. Although the above description is made on an example of a semiconductor device to be processed by the plating process of the invention of an IGBT, the plating process of the invention is also applicable to a plating process on an electrode of various types of semiconductor devices including a MOSFET and a FWD (a free-wheeling diode).

When a zincating process is conducted as in the conventional technology, the same effect as in the embodiment of the invention is obtained by providing the first titanium film 63. The reason for this is as follows. Even if an etch pit reaching the underlying layer is generated in the first nickel film 62 in etching process of the zincating process, the etching is stopped at the first titanium film 63 under the first nickel film 62. As a consequence, the first aluminum film 61 is prevented from exposing on the surface of the emitter electrode 6, ensuring adhesiveness between the emitter electrode 6 and a solder. The same effect is obtained by the second titanium film 93.

As described thus far, the method of manufacturing a semiconductor device according to the present invention is effective for manufacturing a semiconductor device with a relatively small thickness. The method is suited in particular for application to manufacture of power semiconductor devices such as IGBTs used in industrial fields including general purpose inverters, AC servo devices, uninterrupted power supplies (UPSs), and switching power supplies, and home appliances including microwave ovens, electronic rice cookers, and strobes.

What is claimed is:

1. A method of manufacturing a semiconductor device on a semiconductor substrate, comprising:
    forming a first metal film on a front surface of the semiconductor substrate;
    forming a second metal film on the front surface of the first metal film;
    activating a surface of the second metal film to provide an activated surface; and
    forming a plated film on the activated surface by a wet plating method in a plating bath that includes a reducing agent that is oxidized during plating and that has a rate of oxidation,
    wherein the second metal film is a metal film mainly composed of a first substance that enhances the rate of oxidation of the reducing agent in the plating bath.

2. The method of manufacturing a semiconductor device according to claim 1, further comprising:
    forming a pattern in the second metal film by an etching process prior to activating the surface of the second metal film; and
    forming a pattern in the first metal film by an etching process after the pattern in the second metal film is formed and prior to activating the surface of the second metal film.

3. The method of manufacturing a semiconductor device according to claim 1, further comprising:
    forming a pattern in the first metal film by an etching process prior to forming the second metal film on the surface of the first metal film; and
    forming a pattern in the second metal film by an etching process after forming the second metal film and prior to activating the surface of the second metal film.

4. The method of manufacturing a semiconductor device according to claim 1, wherein activating the surface of the second metal layer includes removing a surface oxide film from the surface of the second metal film.

5. The method of manufacturing a semiconductor device according to claim 1, wherein forming the plated film includes forming a first plated film on the surface of the second metal film that is mainly composed of a second substance that enhances the rate of oxidation of the reducing agent in the plating bath.

6. The method of manufacturing a semiconductor device according to claim 5, wherein the second substance is nickel.

7. The method of manufacturing a semiconductor device according to claim 5, wherein forming the plated film further comprises forming a second plated film on the surface of the first plated film that is mainly composed of a third substance that brings about a substitution reaction for the first plated film.

8. The method of manufacturing a semiconductor device according to claim 7, wherein the third substance is gold.

9. The method of manufacturing a semiconductor device according to claim 1, wherein the first metal film is formed by one of an evaporation method or a sputtering method.

10. The method of manufacturing a semiconductor device according to claim 1, wherein the first metal film is mainly composed of aluminum.

11. The method of manufacturing a semiconductor device according to claim 1, wherein the first metal film is composed of an alloy of one of aluminum-silicon or aluminum-silicon-copper.

12. The method of manufacturing a semiconductor device according to claim 1, wherein the second metal film is a laminated metal film formed by laminating a third metal film having a high melting point and a film mainly composed of the first substance in this order.

13. The method of manufacturing a semiconductor device according to claim 12, wherein the third metal film is composed of a metal selected from the group consisting of titanium, molybdenum, chromium, cobalt, and tungsten.

14. The method of manufacturing a semiconductor device according to claim 1, wherein the first substance is nickel.

15. The method of manufacturing a semiconductor device according to claim 1, wherein the wet plating method is an electroless plating method.

16. The method of manufacturing a semiconductor device according to claim 1, further comprising:
    forming a rear surface electrode on the rear surface of the semiconductor substrate after forming the second metal film and before activating the surface of the second metal film,
    wherein the first metal film and the second metal film form a front surface electrode on the front surface of the semiconductor substrate, and
    wherein forming the plated film includes simultaneously forming plated films on the surface of the front surface electrode and on the surface of the rear surface electrode.

17. The method of manufacturing a semiconductor device according to claim 16, further comprising:
    reducing thickness of the semiconductor substrate to a value not larger than 200 μm by working the rear surface of the semiconductor substrate between forming the first metal film and forming the rear surface electrode.

* * * * *